United States Patent
Morooka et al.

(10) Patent No.: US 6,597,169 B2
(45) Date of Patent: Jul. 22, 2003

(54) SIGNAL DETECTOR USING SUPERCONDUCTING QUANTUM INTERFERENCE DEVICE AND MEASURING METHOD THEREFORE

(75) Inventors: Toshimitsu Morooka, Chiba (JP); Keiichi Tanaka, Chiba (JP); Tatsuji Ishikawa, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/021,417

(22) Filed: Oct. 29, 2001

(65) Prior Publication Data

US 2002/0128156 A1 Sep. 12, 2002

(30) Foreign Application Priority Data

Nov. 9, 2000 (JP) ........................................ 2000-341862

(51) Int. Cl.[7] ............................................. G01R 33/035
(52) U.S. Cl. ........................................ 324/248; 505/846
(58) Field of Search .............................. 324/248; 326/5; 505/162, 846; 327/367, 527, 528

(56) References Cited

U.S. PATENT DOCUMENTS

| | | | |
|---|---|---|---|
| 5,280,242 A | * | 1/1994 | Odawara et al. ............. 324/248 |
| 5,287,058 A | * | 2/1994 | Goto et al. .................. 324/248 |
| 5,291,135 A | * | 3/1994 | Hotta et al. .................. 324/248 |
| 5,469,057 A | * | 11/1995 | Robinson .................... 324/248 |
| 6,388,440 B1 | * | 5/2002 | Nagaishi et al. ............. 324/248 |

* cited by examiner

*Primary Examiner*—Gerard R. Strecker
(74) *Attorney, Agent, or Firm*—Adams & Wilks

(57) ABSTRACT

A signal detector has a SQUID, a bias current supply circuit for supplying a bias current to the SQUID, and a drive circuit for detecting a magnetic flux by receiving a voltage signal of the SQUID and reading out the input signal as an output voltage. The drive circuit has two systems including a flux-locked loop system for converting a voltage signal of the SQUID into a current signal and making a magnetic flux inside the SQUID constant by feeding back a signal whereto, and an output system separate from and operating independently of the flux-locked loop system for converting a voltage signal of the SQUID and reading out the converted voltage signal without feeding back a signal to the SQUID.

20 Claims, 4 Drawing Sheets

6 BIAS CURRENT SUPPLY CIRCUIT
7-2 AMPLIFIER CIRCUIT
7-1 AMPLIFIER CIRCUIT
8 INTEGRATOR
9 REFERENCE VOLTAGE GENERATING CIRCUIT
10 FEEDBACK CIRCUIT
12 MODULATION CIRCUIT

6 BIAS CURRENT SUPPLY CIRCUIT 7-2 AMPLIFIER CIRCUIT 7-1 AMPLIFIER CIRCUIT

8 INTEGRATOR

9 REFERENCE VOLTAGE GENERATING CIRCUIT

10 FEEDBACK CIRCUIT

12 MODULATION CIRCUIT

6 BIAS CURRENT SUPPLY CIRCUIT 7-2 AMPLIFIER CIRCUIT 7-1 AMPLIFIER CIRCUIT

8 INTEGRATOR

9 REFERENCE VOLTAGE GENERATING CIRCUIT

10 FEEDBACK CIRCUIT

12 MODULATION CIRCUIT

15 FILTER

SIGNAL DETECTOR USING SUPERCONDUCTING QUANTUM INTERFERENCE DEVICE AND MEASURING METHOD THEREFORE

BACKGROUND OF THE INVENTION

The present invention relates to a signal detector for detecting weak (or small) magnetic fields, electrical currents, voltage, electromagnetic wavers, etc. using a superconducting quantum interference device, which is a highly sensitivity magnetic sensor, and to a measuring method therefor, and more particularly relates to a broadband detector for measuring a high speed signal.

FIG. 6 shows an equivalent circuit diagram of a direct-current superconducting quantum interference device (hereafter referred to as a DC-SQUID). The DC-SQUID forms a superconducting ring using a SQUID inductance 2 and a pair of Josephson junctions 1 connected to the two ends of the SQUID inductance 2. A modulation coil 3 is magnetically coupled to the superconducting ring. An input coil 4 for inputting a signal is also magnetically coupled to the superconducting ring.

The DC-SQUID is a magnetic flux-voltage transducer for periodically converting voltage Vs on both ends of the superconducting ring to a single magnetic flux quantum ($\Phi_0$: $2.07 \times 10^{-}$ · Wb) for a magnetic flux $\Phi$ mixed inside the superconducting ring. With a constant bias current supplied to the DC-SQUID, the magnetic flux-voltage characteristic is shown in FIG. 2A. As shown in FIG. 2A the DC-SQUID has high sensitivity to magnetic flux, but this response is non-linear and the dynamic range is narrow. In the case of low frequency measurement, in order to obtain sufficient linearity and timing a Flux locked loop (FLL) method, being a type of null-balance method, is used to drive the SQUID. However, the FLL method constructs a closed loop circuit, which means that with broadband over 1 MHz stable drive is difficult due to going out of lock etc. With broadband measurement, it is also possible to utilize a method where the SQUID is driven by an open loop circuit having a simple circuit structure.

FIG. 7 is a schematic diagram of a signal detector using a superconducting quantum interference device with an open loop circuit of the related art. This detector is comprised of a bias current supply circuit 6 for applying bias current I, a broadband amplifier circuit 7 for amplifying a voltage Vs of the DC-SQUID 5, and a modulation circuit 12 for moving operation points on the magnetic flux-voltage curve to given positions. The modulation circuit 12 supplies a modulation signal Im to the SQUID through a modulation coil 3. At that time, using the magnetic flux-voltage curve of FIG. 2A, the magnetic flux-voltage conversion coefficient is adjusted so as to be fixed at point A on a rapidly changing part of the graph. Voltage Vo that has been amplified by the amplifier circuit 7 is output as output voltage Vout, and the magnetic flux-voltage conversion coefficient, as well as an input signal from the mutual inductance between the input coil and the SQUID loop, are obtained.

In the case of using an open loop circuit, the structure of a drive circuit becomes simple, and high speed signal measurement becomes easy. However, due to external causes, such as environmental magnetic noise, source noise etc., there is movement of the operating points on the magnetic flux-voltage curve. Because of this movement of the operating points, there is a problem that the magnetic flux-voltage conversion coefficient required in obtaining the input signal from the output voltage also changes.

Also, since there is no linear region in the magnetic flux-voltage characteristic of the SQUID, there is a problem that it is not possible to accurately obtain the input signal from the output voltage.

SUMMARY OF THE INVENTION

A drive circuit for magnetic flux detection for reading out an input signal as an output voltage is made up of two systems, one being a flux-locked loop system for converting a voltage signal of the superconducting quantum interference device to a current signal and making magnetic flux inside the superconducting ring constant by feeding back a feedback signal to the modulation coil, and another being an output system for converting a voltage signal of the superconducting quantum interference device to a voltage signal, and not feeding back to the modulation coil but reading out the converted voltage signal as an output voltage.

Also, the frequency band of the flux-locked loop system is narrower than the frequency band of the output system.

The frequency band of the flux-locked loop system can also be controlled to take a given value. Further, a method of using the inventive device comprises the steps of measuring a flux-voltage curve of the superconducting quantum interference device before measuring an input signal, and converting an output signal obtained from the output system of the drive circuit into an input signal by comparison with the flux-voltage curve.

DETAILED DESCRIPTION OF THE INVENTION

An embodiment of the present invention will be described in the following with reference to FIG. 1.

Embodiment 1

Figure 1:
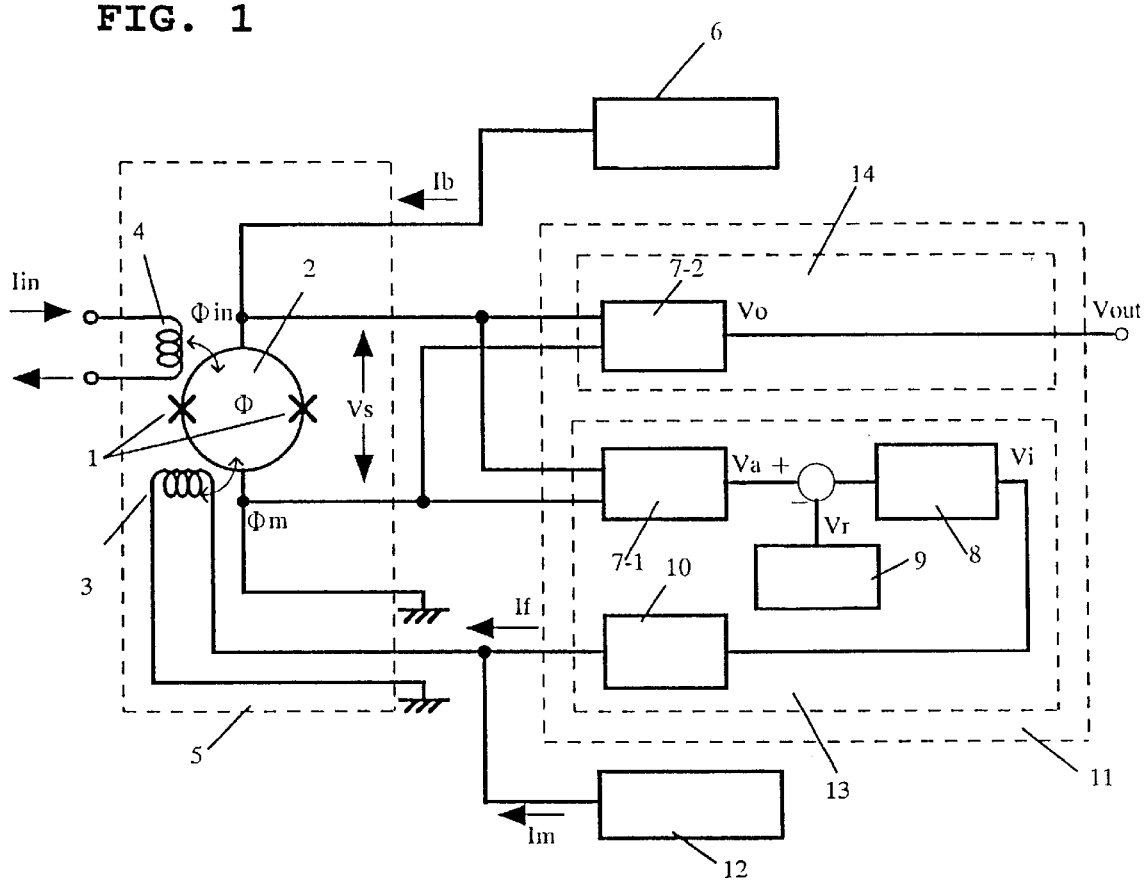
FIG. 1 is a schematic diagram of a measurement device using a superconducting quantum interference device illustrating a first embodiment of the present invention.
Figure 2A:
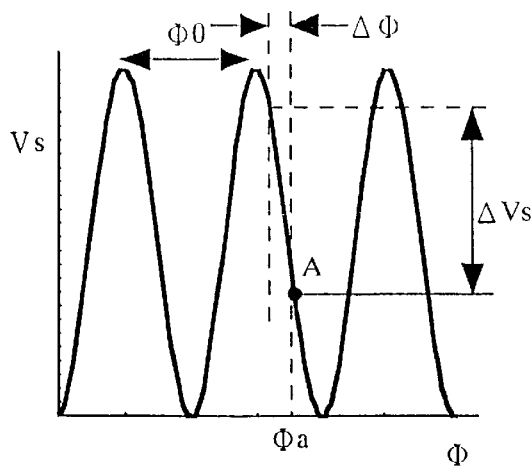
FIG. 2A is a magnetic flux-voltage characteristic of a DC-SQUID.

FIG. 1 is a schematic diagram of a signal detector using a superconducting quantum interference device illustrating a first embodiment of the present invention. A DC-SQUID 5 is comprised of a pair of Josephson junctions 1, a SQUID inductance 2, a feedback-modulation coil 3, and an input coil 4. A superconducting ring is formed using a SQUID inductance 2 and the pair of Josephson junctions 1 connected to the two ends of the SQUID inductance 2. The feedback-modulation coil 3 is magnetically coupled to the superconducting ring. The input coil 4 for inputting magnetic flux is also magnetically coupled to the superconducting ring. The magnetic flux-voltage characteristic acquired with a constant bias current supplied to the DC-SQUID is shown in FIG. 2A. A DC-SQUID drive circuit is comprised of a bias current supply circuit 6 for applying bias current Ib, a drive circuit for magnetic flux detection 11 for reading out an input signal as an output voltage, and a modulation circuit 12 for moving operation points on the magnetic flux-voltage curve to given positions.

The drive circuit for magnetic flux detection 11 has two systems, namely a flux-locked loop system 13 and an output system 14.

The flux-locked loop system 13 comprises an amplifier circuit AMP 7-1, an integrator INT 8, a reference signal generating circuit REF 9, and a feedback circuit FB 10, and has a function of keeping the flux Φ inside the superconducting ring constant by converting a voltage signal Vs of the DC-SQUID 5 into a current signal and feeding back to the modulation coil 3 as a feedback signal If. The output system 14 consists solely of a broadband amplifier circuit AMP 7-2, and has a function of amplifying a voltage Vs of the DC-SQUID 5 and converting it to a voltage signal Vo. The output of the output system 14 is not fedback to the modulation coil 3. The modulation circuit 12 generates a modulation signal Im, and applies magnetic flux to Φm to the SQUID through the modulation coil 3. At that time, with the magnetic flux-voltage curve of FIG. 2A, magnetic flux is applied to the SQUID using the modulation circuit 12, and the operating point is adjusted so as to become point A of the magnetic flux-voltage conversion coefficient.

Figure 2B:
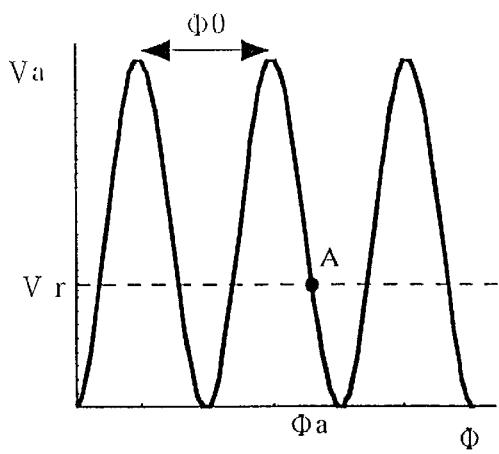
FIG. 2B is a magnetic flux-voltage characteristic after amplification.

FIG. 2B shows a magnetic flux-voltage characteristic measured after amplification by the amplifier circuit 7-1. In the flux-locked loop system 13, a signal Vs fed from the DC-SQUID 5 is amplified by the amplifier circuit 7-1 to a voltage Va, a change portion ΔV of a difference (Va−Vr) between that voltage Va and a reference signal Vr fed by the reference signal generating circuit 9 is stored as Vi by the integrator 8, and converted to a feedback current If proportional to Vi by the feedback circuit 10. Operation is then carried out so that the magnetic flux inside the superconducting ring is always Φa. The cut-off frequency fcf for the response frequency of the feedback signal If for the input signal Iin of the flux-locked loop system is represented by the following equation 1.

$$f_{cf} = \frac{V_\phi G_a M_f}{2\pi \tau_i R_f} \quad \text{Equation 1}$$

The magnetic flux-voltage conversion coefficient of the DC-SQUID 5 is VΦ, gain of the amplifier circuit 7 is Ga, time constant of the integrator 8 is τi, feedback ratio of the feedback circuit 10 is Rf, and mutual inductance between the modulation coil 3 and the SQUID inductance 2 is Mf.

Figure 3:
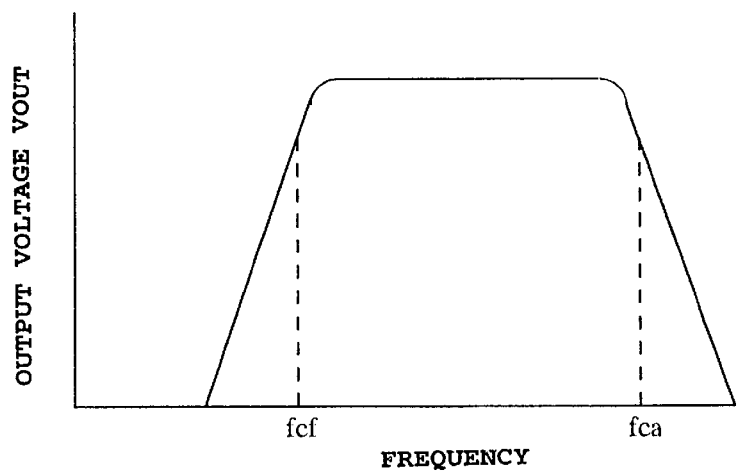
FIG. 3 is a frequency characteristic of a measurement device using a superconducting quantum interference device of the first embodiment of the present invention.

When an input signal Iin having a frequency below fcf is input, magnetic flux inside the SQUID loop is kept constant by the flux-locked loop system 13, and is fixed at point A on the magnetic flux-voltage curve. As a result, for an input signal Iin having a frequency below fcf there is no output through the output system 14. On the other hand, for an input signal Iin having a high frequency above fcf an output voltage Vout is obtained through the output system 14. In FIG. 2A, if a change in magnetic flux inside the SQUID loop due to a high speed input signal is made ΔΦ, the voltage change of the DC-SQUID 5 becomes ΔVs. The output voltage Vout is a value obtained by amplifying ΔVs using the amplifier circuit 7-2. FIG. 3 shows a frequency response characteristic acquired using this embodiment. The horizontal axis represents frequency, and the vertical axis represents output voltage Vout (units have been normalized). A low frequency region up to the cut-off frequency fcf of the flux-locked loop system 13 is cancelled out. fca is the cut-off frequency of the output system.

With this embodiment, low frequency noise due to external causes, such as environmental magnetic noise, noise from commercial power supply etc., is cancelled by the flux-locked loop, and it is possible to stably extract only a high speed signal for which measurement is desired.

Operation points on the magnetic flux-voltage curve also do not vary due to external causes such as environmental magnetic noise and noise from commercial power supply, which means that by performing fitting using a magnetic flux-voltage curve measured before actual measurement, it is possible to accurately obtain an input signal from the output voltage.

Embodiment 2

Figure 4:
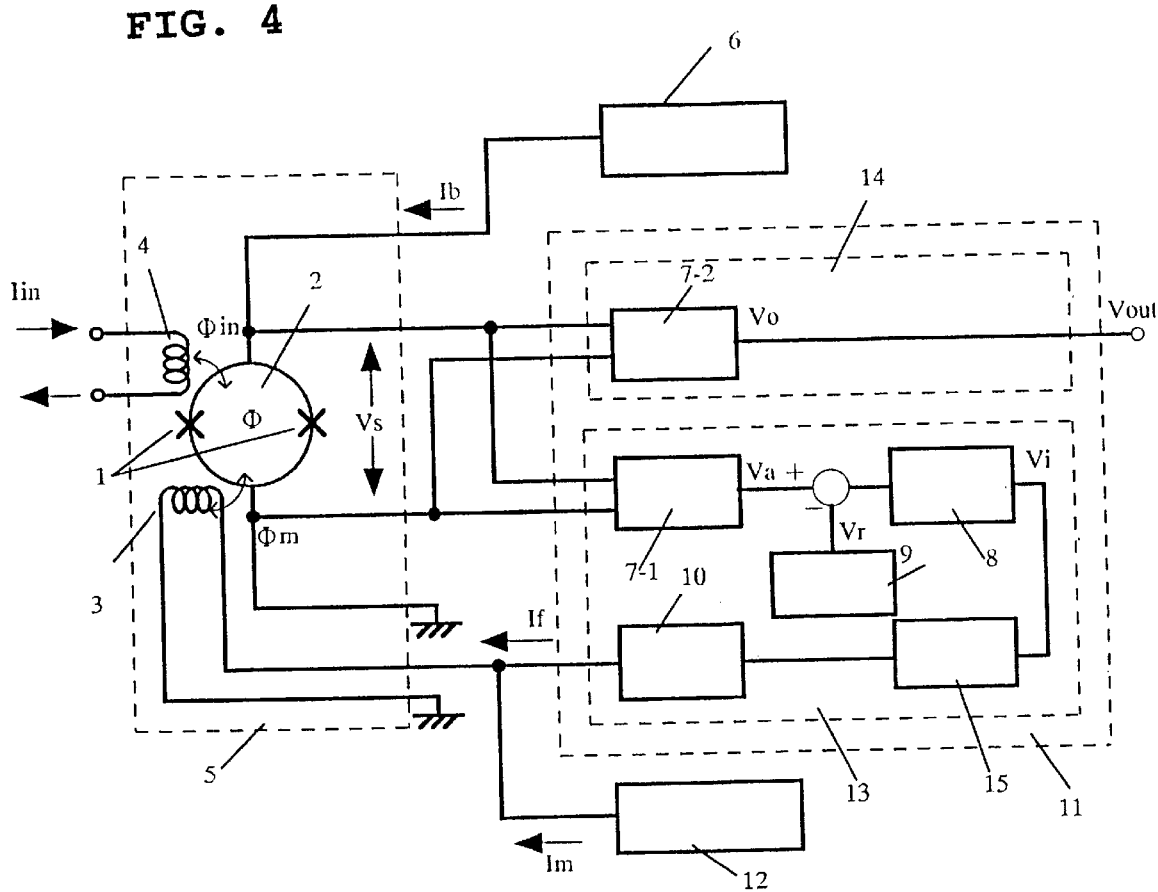
FIG. 4 is a schematic diagram of a measurement device using a superconducting quantum interference device illustrating a second embodiment of the present invention.
Figure 7:
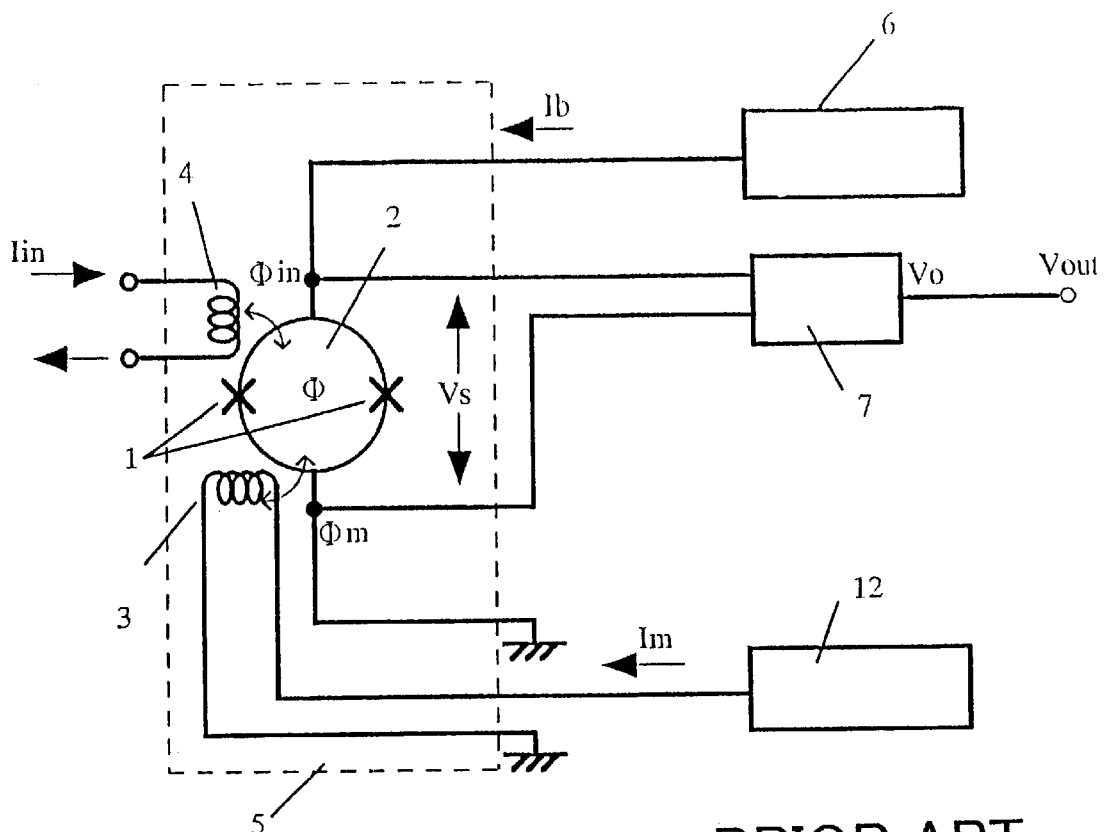
FIG. 7 is a schematic diagram of a superconducting quantum interference magnetic flux meter of the related art.
Figure 6:
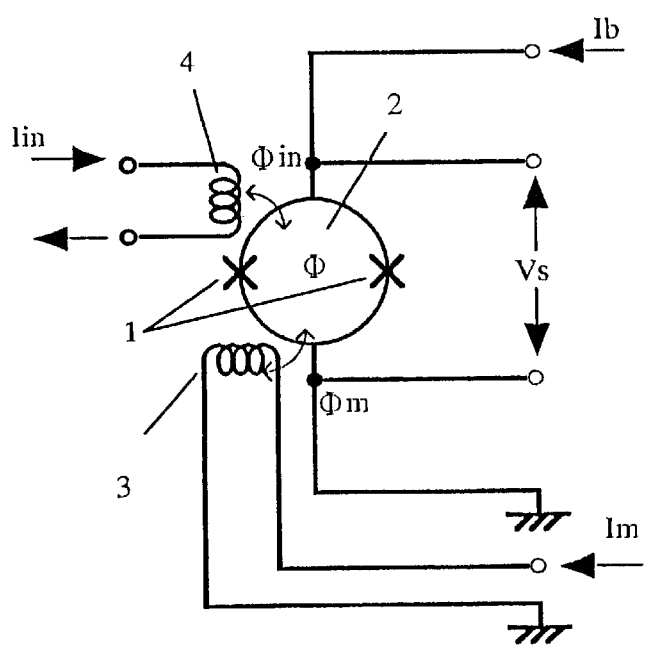
FIG. 6 is an equivalent circuit diagram of a DC-SQUID.

FIG. 4 is a schematic diagram of a signal detector using a superconducting quantum interference device illustrating a second embodiment of the present invention.

A DC-SQUID 5 is comprised of a Josephson junction 1, a SQUID inductance 2, a feedback-modulation coil 3, and an input coil 4. A superconducting ring is formed using a SQUID inductance 2 and a pair of Josephson junction 1 connected to the two ends of the SQUID inductance 2. The feedback-modulation coil 3 is magnetically coupled to the superconducting ring. The input coil 4 for inputting magnetic flux is also magnetically coupled to the superconducting ring. A DC-SQUID drive circuit is comprised of a bias current supply circuit Ib, a drive circuit for magnetic flux detection 11 for reading out an input signal as an output voltage, and a modulation circuit 12 for moving operation points on the magnetic flux-voltage curve to given positions. The drive circuit for magnetic flux detection 11 has two systems, namely a flux-locked loop system 13 and an output system 14. The flux-locked loop system 13 comprises an amplifier circuit 7-1, an integrator 8, a reference signal generating circuit 9, a feedback circuit 10, and a filter 15, and has the function of keeping the flux inside the superconducting ring constant by converting a voltage signal Vs of the DC-SQUID 5 into a corresponding current signal and feeding it back to the modulation coil 3 as a feedback signal If. It is also possible to control the frequency band of the feedback signal If using the filter 15. The output system 14 has a broadband amplifier circuit 7-2, and has the function of amplifying a voltage Vs of the DC-SQUID 5 and converting to a voltage signal Vo. Output of the output system 14 is not fedback to the modulation signal Im, and applies magnetic flux Φm is applied to the SQUID using the modulation circuit 12, and the operating point is adjusted so as to become point A of the magnetic flux-voltage conversion coefficient.

Figure 5:
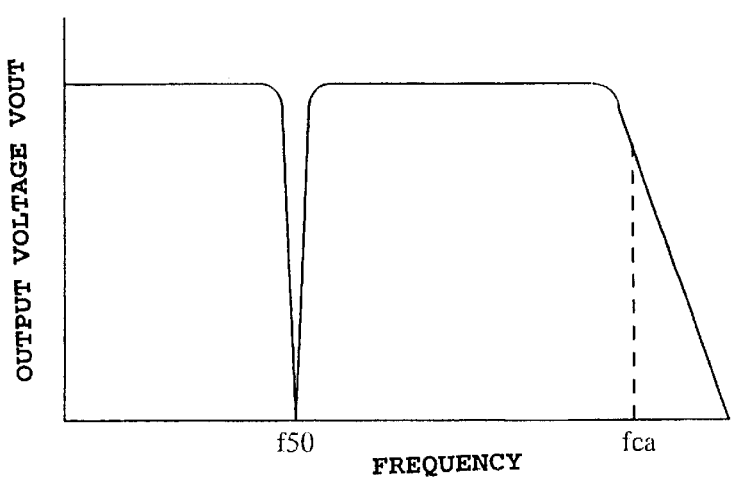
FIG. 5 is a frequency characteristic of a measurement device using a superconducting quantum interference device of the second embodiment of the present invention.

When the filter 15 is a band pass filter passing only a main power frequency f50, and input signal I in a f50 is cancelled by the flux-locked loop system 13. FIG. 5 shows a frequency response characteristic acquired using this embodiment. The horizontal axis represents frequency, and the vertical axis represents output voltage Vout (units have been normalized). Frequency components of f50, being the power frequency, are cancelled. fca is the cut-off frequency of the output system.

With this embodiment, detection of extremely small signals hidden in extremely large noise sources such as noise from a commercial power supply can be measured stably and across a broadband region.

The present invention has been implemented as described above, and has the following effects.

A drive circuit for magnetic flux detection for converting an input signal to a corresponding output voltage is made up of two systems, one being a flux-locked loop system for fixing operation points of a superconducting quantum interference device at given positions on a magnetic flux voltage curve by converting a voltage signal of the superconducting quantum interference device into a corresponding current signal and feeding it back to a modulation coil as a feedback signal, and an output system for converting a voltage signal of the superconducting quantum interference device into a corresponding voltage signal, and not feeding it back to the modulation coil but outputting it as an output voltage, and in this way noise components are cancelled and it is possible to stably extract only a signal that it is desired to measure.

Also, by making the frequency band of the flux-locked loop system narrower than the frequency band of the output system, it is possible to cancel low frequency noise caused by external factors such as environmental magnetic noise and noise from a commercial power supply, which is effective for extremely small, high speed signal detection.

Also, by controlling the frequency band of the flux-locked loop system to a given value, detection of an extremely small signal hidden in extremely large noise sources having specific frequency components, such as noise from a commercial power supply, can be measured stably and across a broadband region.

Operation points on the magnetic flux-voltage curve also do not vary due to external causes such as environmental magnetic noise and noise from commercial power supply, which means that by performing fitting using a magnetic flux-voltage curve measured in advance and before actual measurement, it is possible to accurately obtain an input signal from the output voltage.

What is claimed is:

1. A signal detector comprising:
   a superconducting quantum interference device having a superconducting ring including one or more Josephson junctions, an input coil magnetically coupled to the superconducting ring for receiving an input signal, and a modulation coil magnetically coupled to the superconducting ring for inputting a feedback signal;
   a bias current supply circuit for supplying a bias current to the superconducting quantum interference device; and
   a drive circuit for detecting a magnetic flux by receiving a voltage signal of the superconducting quantum interference device that is changed in response to the feedback signal and reading out the input signal as an output voltage, the drive circuit comprising two systems including a flux-locked loop system for converting a voltage signal of the superconducting quantum interference device into a current signal and making a magnetic flux inside the superconducting ring constant by feeding back a signal as the feedback signal to the modulation coil, and an output system separate from and operating independently of the flux-locked loop system for converting a voltage signal of the superconducting quantum interference device and reading out the converted voltage signal without feeding back a signal to the modulation coil.

2. A signal detector according to claim 1;
   wherein a frequency band of the flux-locked loop system is narrower than a frequency band of the output system.

3. A signal detector according to claim 2;
   wherein the frequency band of the flux-locked loop system can be set to a given value.

4. A measuring method using the signal detector according to claim 1, comprising the steps of:
   measuring a flux-voltage curve of the superconducting quantum interference device before measuring the input signal;
   and converting an output voltage from the output system of the drive circuit for magnetic flux detection to an input signal by comparison with the flux-voltage curve.

5. A measuring method using the signal detector according to claim 2, comprising the steps of:
   measuring a flux-voltage curve of the superconducting quantum interference device before measuring the input signal; and
   converting an output voltage from the output system of the drive circuit for magnetic flux detection to an input signal by comparison with the flux-voltage curve.

6. A measuring method using the signal detector according to claim 3, comprising the steps of:
   measuring a flux-voltage curve of the superconducting quantum interference device before measuring the input signal; and
   converting an output voltage from the output system of the drive circuit for magnetic flux detection to an input signal by comparison with the flux-voltage curve.

7. A signal detector according to claim 1;
   wherein the flux-locked loop detects the magnetic flux when the input signal has a frequency below a predetermined frequency and the output system detects the magnetic flux when the input signal is above the predetermined frequency.

8. A signal detector according to claim 7;
   wherein the output system comprises an amplifier circuit.

9. A signal detector according to claim 7;
   wherein the flux-locked loop comprises an amplifier circuit for amplifying a voltage of the superconducting quantum interference device, an integrator for integrating an output of the amplifier circuit, and a feedback circuit for feeding back an output of the integrator as the feedback signal, and the predetermined frequency comprises a cutoff frequency Fcf of the flux-locked loop defined by the expression:

$$V_\Phi G_a M_f / 2\pi \tau_i R_f$$

wherein $V_\Phi$ is a magnetic flux-voltage conversion coefficient of the superconducting quantum interference device, $G_a$ is a gain of the amplifier circuit, $M_f$ is an inductance of the superconducting quantum interference device, $\tau_i$ is a time constant of the integrator, and $R_f$ is a feedback ratio of the feedback circuit.

10. A signal detector comprising:
    a SQUID; and
    a magnetic flux detecting circuit connected to the SQUID for detecting a signal input to the squid by receiving a voltage of the SQUID and outputting a corresponding output signal, the magnetic flux detecting circuit comprising a first output circuit for producing the output signal when the input signal is below a predetermined frequency and a second output circuit operating independently of the first output circuit for producing the output signal only when the input signal is above the predetermined frequency.

11. A signal detector according to claim 10;
wherein the first output circuit comprises a flux-locked loop circuit for maintaining a magnetic flux inside the SQUID constant by feeding back a feedback signal to a modulation coil of the SQUID; and
the predetermined frequency comprises a cutoff frequency of the flux-locked loop circuit.

12. A signal detector according to claim 11;
wherein the flux-locked loop circuit comprises an amplifier circuit for amplifying a voltage of the SQUID, an integrator for integrating an output of the amplifying circuit, and a feedback circuit for feeding back an output of the integrator to the modulation coil, and the cutoff frequency Fcf is defined by the expression:

$$V_\Phi G_a M_f / 2\pi \tau_i R_f$$

wherein $V_\Phi$ is a magnetic flux-voltage conversion coefficient of the SQUID, $G_a$ is a gain of the amplifier circuit, $M_f$ is an inductance of the SQUID, $\tau_i$ is a time constant of the integrator, and $R_f$ is a feedback ratio of the feedback circuit.

13. A signal detector according to claim 12;
wherein the second output circuit comprises an amplifier circuit for amplifying the SQUID voltage and producing the output signal when the input signal has a frequency greater than the cutoff frequency of the flux-locked loop circuit.

14. A signal detector according to claim 11;
wherein the second output circuit comprises an amplifier circuit for amplifying the SQUID voltage and producing the output signal when the input signal has a frequency greater than the cutoff frequency of the flux-locked loop circuit.

15. A signal detector according to claim 10;
wherein the SQUID comprises a superconducting ring including one or more Josephson junctions, an input coil magnetically coupled to the superconducting ring for receiving an input signal, and a modulation coil magnetically coupled to the superconducting ring for inputting a feedback signal.

16. A signal detector according to claim 10;
further comprising a bias current supply circuit for supplying a bias current to the SQUID.

17. A signal detector according to claim 10;
further comprising a modulation circuit for moving operation points on the magnetic flux - voltage characteristic curve of the SQUID to given positions.

18. A signal detector according to claim 10;
wherein the magnetic flux detecting circuit detects a magnetic flux by receiving a voltage signal of the SQUID that is changed in response to a feedback signal and reading out the input signal as an output voltage.

19. A signal detector according to claim 10;
wherein the first circuit comprises a flux-locked loop, and a frequency band of the flux-locked loop is narrower than a frequency band of the second circuit.

20. A signal detector according to claim 10;
wherein the first circuit comprises a flux-locked loop and a frequency band of the flux-locked loop can be set to a given value.

* * * * *